US007679270B2

(12) United States Patent
Nakamura

(10) Patent No.: US 7,679,270 B2
(45) Date of Patent: Mar. 16, 2010

(54) ULTRASONIC PROBE

(75) Inventor: Takashi Nakamura, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/236,097

(22) Filed: Sep. 23, 2008

(65) Prior Publication Data

US 2009/0085440 A1 Apr. 2, 2009

(30) Foreign Application Priority Data

Sep. 28, 2007 (JP) ............................ 2007-255358

(51) Int. Cl.
*H01L 41/08* (2006.01)

(52) U.S. Cl. ...................................................... 310/334

(58) Field of Classification Search ................. 310/334, 310/358, 311, 366, 367, 357; 600/436-437, 600/459; 252/62.9; 367/155, 157; *H01L 41/08*
See application file for complete search history.

(56) References Cited

U.S. PATENT DOCUMENTS 5,030,874 A * 7/1991 Saito et al. .................. 310/334
6,020,675 A * 2/2000 Yamashita et al. .......... 310/334

FOREIGN PATENT DOCUMENTS

JP 2006-320415 A 11/2006

* cited by examiner

*Primary Examiner*—Walter Benson
*Assistant Examiner*—Karen B Addison
(74) *Attorney, Agent, or Firm*—Sughrue Mion, PLLC

(57) ABSTRACT

A wideband and high sensitive ultrasonic probe adaptable to harmonic imaging by improving the sensitivity of vibrators in a wider frequency band without hindering the operation of piezoelectric materials. The ultrasonic probe includes: a vibrator array including plural vibrators for transmitting and/or receiving ultrasonic waves, each of the plural vibrators including plural piezoelectric materials arranged in parallel between a first electrode and a second electrode and having different frequency constants from one another; at least one acoustic matching layer provided on a first surface of the vibrator array; and a backing material provided on a second surface opposite to the first surface of the vibrator array.

7 Claims, 10 Drawing Sheets

FIG.5

| PIEZOELECTRIC MATERIAL | TYPE | COMPOSITION | N33 | k33 | ε33 | d33 |
|---|---|---|---|---|---|---|
| $Ba(Ti, Zr)O_3$ | SINGLE CRYSTAL MATERIAL | $Ba(Ti_{0.925}Zr_{0.075})O_3$ | 1050 | 0.80 | 1670 | 655 |
| C-91H | SOFT MATERIAL, SINTERED MATERIAL | 35%PNN-26%PZ-39%PT | 1350 | 0.73 | 4430 | 610 |
| PMN-PT | SINGLE CRYSTAL MATERIAL | $Pb(Ni, Nb)O_3$-PbTiO | 724 | 0.93 | 6750 | 2350 |
| C-213 | HARD MATERIAL, SINTERED MATERIAL | PZT-Nb-Mn | 1540 | 0.70 | 1470 | 310 |
| $KNbO_3$ | SINGLE CRYSTAL MATERIAL | $KNbO_3$ | 1038 | 0.75 | 250 | 95 |

ULTRASONIC PROBE

BACKGROUND OF THE INVENTION

1. Field of the Invention

The present invention relates to an ultrasonic probe for transmitting and/or receiving ultrasonic waves in an ultrasonic diagnostic apparatus for medical use or structure flaw detection, and specifically, to an ultrasonic probe suitable for wideband ultrasonic transmission and reception.

2. Description of a Related Art

In medical fields, various imaging technologies have been developed in order to observe the interior of an object to be inspected and make diagnoses. Especially, ultrasonic imaging for acquiring interior information of the object by transmitting and receiving ultrasonic waves enables image observation in real time and provides no exposure to radiation unlike other medical image technologies such as X-ray photography or RI (radio isotope) scintillation camera. Accordingly, ultrasonic imaging is utilized as an imaging technology at a high level of safety in a wide range of departments including not only the fetal diagnosis in the obstetrics, but also gynecology, circulatory system, digestive system, and so on.

The ultrasonic imaging is an image generation technology utilizing the nature of ultrasonic waves that the ultrasonic waves are reflected at a boundary between regions with different acoustic impedances (e.g., a boundary between structures). Typically, an ultrasonic diagnostic apparatus (or referred to as an ultrasonic imaging apparatus or an ultrasonic observation apparatus) is provided with an ultrasonic probe to be used in contact with the object or ultrasonic probe to be used by being inserted into a body cavity of the object. Alternatively, an ultrasonic endoscope is also used in which an endoscope for optically observing the interior of the object is combined with an ultrasonic probe for intracavity.

In the ultrasonic probe, for example, a piezoelectric vibrator having electrodes formed on both ends of a piezoelectric material is used as an ultrasonic transducer for transmitting and/or receiving ultrasonic waves. When a voltage is applied to the electrodes of the vibrator, the piezoelectric material expands and contracts to generate ultrasonic waves. Further, plural vibrators are one-dimensionally or two-dimensionally arranged and the vibrators are sequentially driven by drive signals provided with predetermined delays, and thereby, an ultrasonic beam can be formed toward a desired direction. On the other hand, the vibrator receives the propagating ultrasonic waves, and expands and contracts to generate an electric signal. The electric signal is used as a reception signal of ultrasonic waves.

Recently, in order to further bring out the usefulness of methods such as harmonic imaging, a demand for wider bandwidth has been made for an ultrasonic diagnostic apparatus, and there has been a problem of how to broaden the frequency characteristics of a vibrator to the wider bandwidth.

As a related technology, Japanese Patent Application Publication JP-P2006-320415A discloses an ultrasonic probe having wideband frequency characteristics and high sensitive characteristics adaptable to harmonic imaging for the purpose of uniforming the slice thickness of ultrasonic images and reducing side lobes. The ultrasonic probe has a piezoelectric vibrator unit in which plural piezoelectric layers including plural piezoelectric materials arranged in a scan direction are stacked with electrodes in between, and the piezoelectric material forming at least one piezoelectric layer within the plural piezoelectric layers is made of a composite piezoelectric material in which a piezoelectric material part and a non-piezoelectric material part are mixed.

Thereby, in a region where the non-piezoelectric material part and the piezoelectric layer are stacked, the sensitivity to high frequencies becomes higher than that in a region where the piezoelectric material part and the piezoelectric layer are stacked. However, the non-piezoelectric material part does not expand or contract when an electric field is applied, and thus, shearing stress may be generated between the non-piezoelectric material part and the piezoelectric layer and cracking may occur.

SUMMARY OF THE INVENTION

The present invention has been achieved in view of the above-mentioned problems. A purpose of the present invention is to provide a wideband and high sensitive ultrasonic probe adaptable to harmonic imaging by improving the sensitivity of vibrators in a wider frequency band without hindering the operation of piezoelectric materials.

In order to accomplish the purpose, an ultrasonic probe according to one aspect of the present invention includes: a vibrator array including plural vibrators for transmitting and/or receiving ultrasonic waves, each of the plural vibrators including plural piezoelectric materials arranged in parallel between a first electrode and a second electrode and having different frequency constants from one another; at least one acoustic matching layer provided on a first surface of the vibrator array; and a backing material provided on a second surface opposite to the first surface of the vibrator array.

According to the present invention, since each of the plural vibrators includes plural piezoelectric materials arranged in parallel between the first electrode and the second electrode and having different frequency constants from one another, the wideband and high sensitive ultrasonic probe adaptable to harmonic imaging can be provided by improving the sensitivity of vibrators in a wider frequency band without hindering the operation of piezoelectric materials.

BRIEF DESCRIPTION OF THE DRAWINGS

FIG. 5 is a table showing performance of piezoelectric materials that can be used in the respective embodiments of the present invention;

DESCRIPTION OF THE PREFERRED EMBODIMENTS

Figure 1:
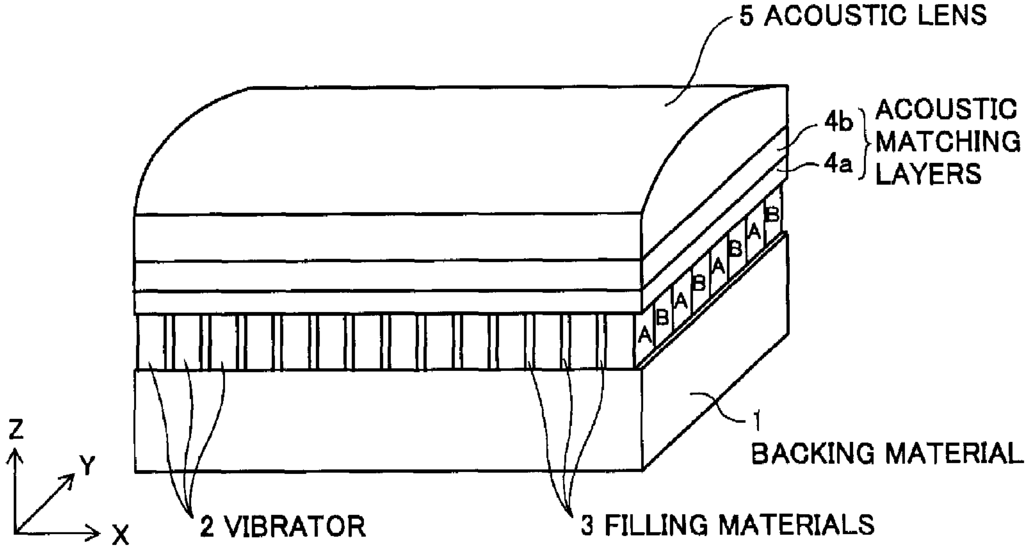
FIG. 1 is a perspective view schematically showing an internal structure of an ultrasonic probe according to the first embodiment of the present invention.

Hereinafter, preferred embodiments of the present invention will be explained in detail with reference to the drawings. The same reference numerals will be assigned to the same component elements and the description thereof will be omitted.

FIG. 1 is a perspective view schematically showing an internal structure of an ultrasonic probe according to the first embodiment of the present invention. The ultrasonic probe is used in contact with an object to be inspected when extracavitary scan is performed or used by being inserted into a body cavity of the object when intracavitary scan is performed.

As shown in FIG. 1, the ultrasonic probe has a backing material 1, plural ultrasonic transducers (piezoelectric vibrators) 2 provided on the backing material 1, filling materials 3 of epoxy resin or the like filling between or around the plural vibrators 2 for reducing the interference between the vibrators and suppressing the vibration of the vibrators in the lateral direction and allowing the vibrators to vibrate only in the longitudinal direction, at least one acoustic matching layer (two acoustic matching layers 4*a* and 4*b* are shown in FIG. 1) provided on the piezoelectric vibrators 2, an acoustic lens 5 provided on the acoustic matching layers according to need. In the embodiment, the plural piezoelectric vibrators 2 arranged in an azimuth direction (X-axis direction) form a one-dimensional vibrator array.

Figure 2:
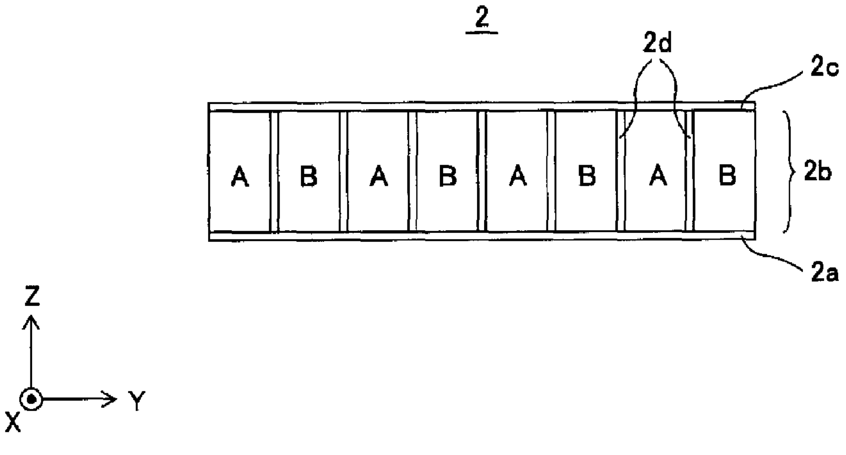
FIG. 2 is a side view showing the vibrator used in the ultrasonic probe according to the first embodiment of the present invention.

FIG. 2 is a side view showing the vibrator used in the ultrasonic probe according to the first embodiment of the present invention. Each vibrator 2 includes an individual electrode 2*a* provided on the backing material 1 (FIG. 1), a piezoelectric material layer 2*b* including two kinds of piezoelectric materials “A” and “B” arranged in parallel on the individual electrode 2*a*, and a common electrode 2*c* provided on the piezoelectric material layer 2*b*. The polarization direction of the piezoelectric materials “A” and “B” is the Z-axis direction.

In the piezoelectric material layer 2*b*, the space between the two piezoelectric materials “A” and “B” adjacent in an elevation direction (Y-axis direction) are filled with insulating materials 2*d* containing an adhesive agent or a filling material such as epoxy resin or the like. It is desirable that the insulating material 2*d* has a high insulation property and resistivity equal to or more than $1\times10^{12}\Omega$cm. Thereby, electric isolation between the individual electrode 2*a* and the common electrode 2*c* is held. Further, it is desirable that the shore hardness “D” of the insulating material 2*d* is less than “65”.

Typically, the common electrodes 2*c* of the plural vibrators are commonly connected to the ground potential (GND) Further, the individual electrodes 2*a* of the plural vibrators are connected to cables (shield cables) via printed wiring formed on two FPCs (flexible printed circuit boards) provided on the front face and rear face of the backing material 1, for example, and furthermore, connected to an electronic circuit within an ultrasonic diagnostic apparatus main body via the cables.

The vibrators 2 generate ultrasonic waves based on the drive signals supplied from the ultrasonic diagnostic apparatus main body. Further, the vibrators 2 receive ultrasonic echoes propagating from the object and generate electric signals. The electric signals are outputted to the ultrasonic diagnostic apparatus main body and processed as reception signals of the ultrasonic echoes.

Referring to FIG. 1 again, the acoustic matching layers 4*a* and 4*b* provided on the front surface of the vibrators 2 are formed of Pyrex (registered trademark) glass or an epoxy resin containing metal powder, which easily propagates ultrasonic waves, for example, and provides matching of acoustic impedances between the object as a living body and the vibrators 2. Thereby, the ultrasonic waves transmitted from the ultrasonic vibrators 2 efficiently propagate within the object.

The acoustic lens 5 is formed of silicone rubber, for example, and focuses an ultrasonic beam transmitted from the ultrasonic transducer array 12 and propagating through the acoustic matching layers 4*a* and 4*b* at a predetermined depth within the object.

In the vibrator shown in FIG. 2, the piezoelectric materials “A” and “B” have frequency constants “N” different from each other. The frequency constant “N” is expressed by the product of resonance frequency $f_R$ (Hz) of the piezoelectric material and the length (m) in the propagation direction of the piezoelectric material as shown by the following equation (1). The unit of the frequency constant “N” is m·Hz.

$$N=f_R\times L \tag{1}$$

The frequency constant varies in expression according to the vibration mode of the piezoelectric material, and the frequency constant in the vibration mode in the longitudinal direction of a rod-like piezoelectric material is expressed by N33.

As another condition for the piezoelectric materials “A” and “B”, it is desirable that the relative permittivity ϵ33 and the equivalent piezoelectric constant d33 take values close to each other between the piezoelectric material “A” and the piezoelectric material “B”. This is because the relative permittivity ϵ33 affects the drive efficiency of the vibrator and the equivalent piezoelectric constant d33 affects the transmission and reception sensitivity of the vibrator.

Figure 3:
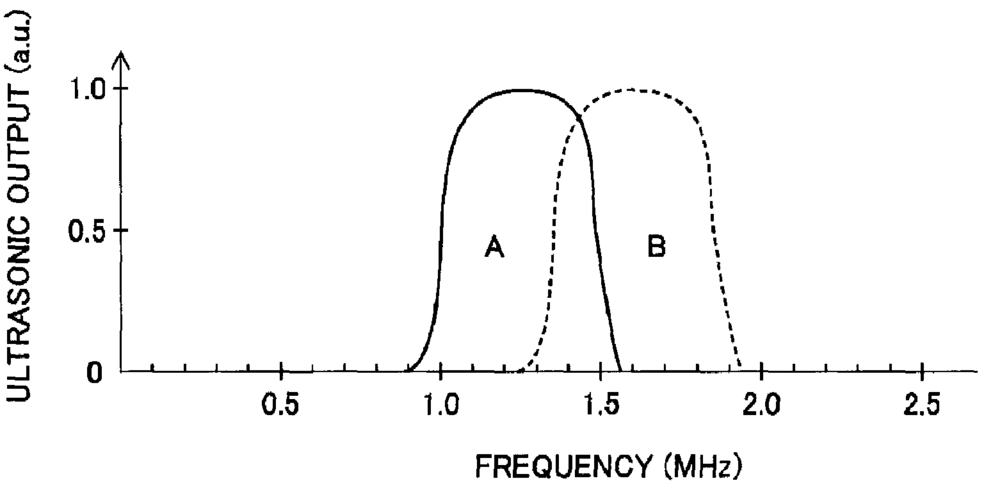
FIG. 3 shows frequency characteristics of a first example using a first set of piezoelectric materials in the vibrator shown in FIG. 2.

FIG. 3 shows frequency characteristics of a first example using a first set of piezoelectric materials in the vibrator shown in FIG. 2. In the first example, $Ba(Ti, Zr)O_3$ (manufactured by Ceracomp) is used as the piezoelectric material “A”, and C-91H (manufactured by FUJI CERAMIC) is used as the piezoelectric material “B”. The piezoelectric material “A” generates an ultrasonic output having the first frequency characteristic shown by the solid line and the piezoelectric material “B” generates an ultrasonic output having the second frequency characteristic shown by the broken line. At the frequency at which the first frequency characteristic and the second frequency characteristic intersect, the ultrasonic outputs of the piezoelectric materials “A” and “B” are about 0.9-times the respective peak values.

Generally, in the case where plural piezoelectric materials included in one vibrator respectively generate ultrasonic outputs having plural different frequency characteristics, in order not to provide plural peaks in the frequency characteristic of the vibrator, it is desired to set the materials of the plural piezoelectric materials so that each ultrasonic output at a frequency, at which adjacent two of the plural different frequency characteristics intersect, becomes equal to or more than 0.5-times the peak value of respective one of the adjacent two frequency characteristics.

In the frequency characteristics of the piezoelectric materials "A" and "B", frequency bandwidth BW (%) is obtained according to the following equation (2).

$$BW(\%)=100\times(f_H-f_L)/f_C \quad (2)$$

where frequencies $f_H$ and $f_L$ are two frequencies at which the sound pressure attenuates from the peak value by 6 dB ($f_L<f_H$), and the frequency $f_C$ is a center frequency between the frequency $f_L$ and the frequency $f_H$ as expressed by the following equation (3).

$$f_C=(f_L+f_H)/2 \quad (3)$$

According to the first example, while the frequency bandwidth when the piezoelectric material layer 2*b* is formed only of the piezoelectric material "A" is about 70% and the frequency bandwidth when the piezoelectric material layer 2*b* is formed only of the piezoelectric material "B" is about 70%, the frequency bandwidth when the piezoelectric material layer 2*b* is formed of the piezoelectric material "A" and the piezoelectric material "B" is about 85% and the wider bandwidth is realized. The wider bandwidth of the frequency band at reception is similarly realized as that of the frequency band at transmission.

Figure 4:
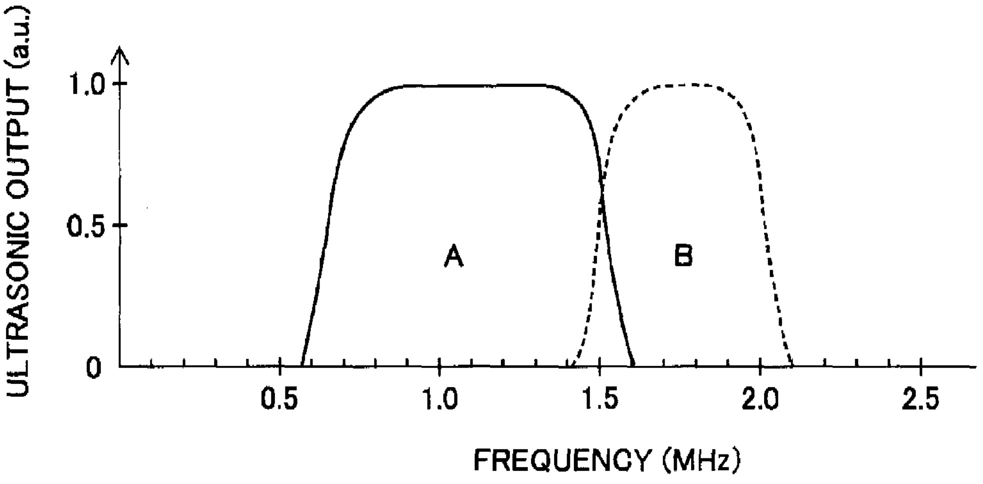
FIG. 4 shows frequency characteristics of a second example using a second set of piezoelectric materials in the vibrator shown in FIG. 2.

FIG. 4 shows frequency characteristics of a second example using a second set of piezoelectric materials in the vibrator shown in FIG. 2. In the second example, PMN-PT (manufactured by MICROFINE) is used as the piezoelectric material "A", and C-213 (manufactured by FUJI CERAMIC) is used as the piezoelectric material "B". The piezoelectric material "A" generates an ultrasonic output having the first frequency characteristic shown by the solid line, and the piezoelectric material "B" generates an ultrasonic output having the second frequency characteristic shown by the broken line. At the frequency at which the second frequency characteristic and the second frequency characteristic intersect, the ultrasonic outputs of the piezoelectric materials "A" and "B" are about 0.6-times the respective peak values.

According to the second example, while the frequency bandwidth when the piezoelectric material layer 2*b* is formed only of the piezoelectric material "A" is about 100% and the frequency bandwidth when the piezoelectric material layer 2*b* is formed only of the piezoelectric material "B" is about 60%, the frequency bandwidth when the piezoelectric material layer 2*b* is formed of the piezoelectric material "A" and the piezoelectric material "B" is about 120% and the wider bandwidth is realized. The wider bandwidth of the frequency band at reception is similarly realized as that of the frequency band at transmission.

FIG. 5 is a table showing performance of piezoelectric materials that can be used in the respective embodiments of the present invention. In FIG. 5, regarding the respective piezoelectric materials, type, composition, frequency constant N33, electromechanical coupling factor k33, relative permittivity $\epsilon$33, and equivalent piezoelectric constant d33 of materials are shown. Among them, an appropriate combination of the piezoelectric materials is selected and used as the piezoelectric materials "A" and "B".

Here, when the values of relative permittivity $\epsilon$33 of the piezoelectric materials "A" and "B" are different, the capacitance in the part of the piezoelectric material "A" differs from the capacitance in the part of the piezoelectric material "B". The capacitance affects the drive efficiency of the vibrator, and accordingly, sizes of the piezoelectric materials "A" and "B" may be varied depending on the values of relative permittivity $\epsilon$33 of the piezoelectric materials "A" and "B" for equal capacitance.

Figure 6:
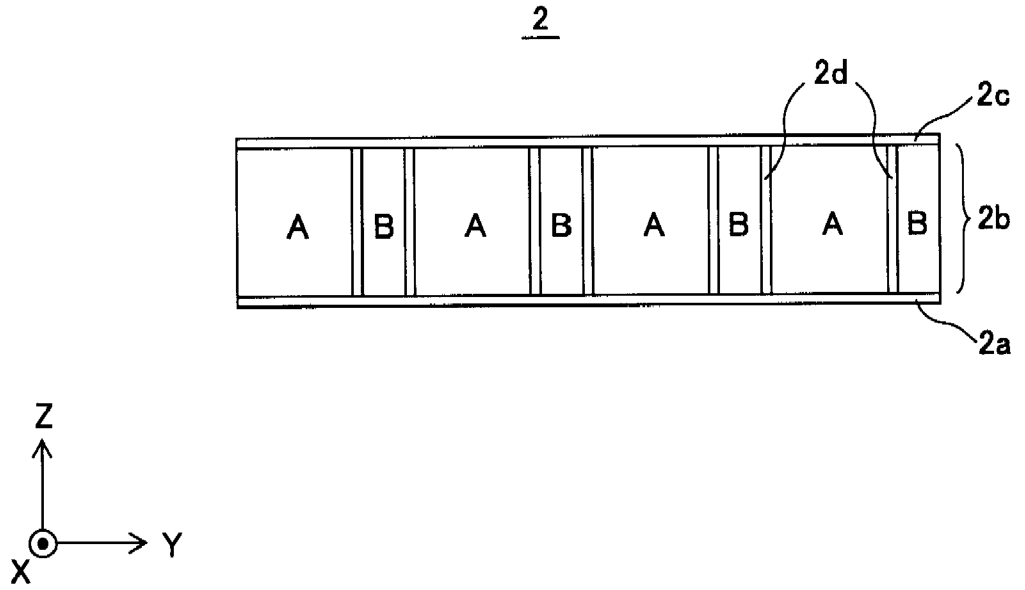
FIG. 6 is a side view showing a first modified example of the vibrator used in the ultrasonic probe according to the first embodiment of the present invention.

FIG. 6 is a side view showing a first modified example of the vibrator used in the ultrasonic probe according to the first embodiment of the present invention. In the first modified example, Ba(Ti,Zr) $O_3$ (manufactured by Ceracomp) having relative permittivity $\epsilon$33 of 1670 is used as the piezoelectric material "A", and C-91H (manufactured by FUJI CERAMIC) having relative permittivity $\epsilon$33 of 4430 is used as the piezoelectric material "B".

Since the ratio of relative permittivity $\epsilon$33 between the piezoelectric materials "A" and "B" is about 1:2.7, the ratio of length in the elevation direction (Y-axis direction) between the piezoelectric materials "A" and "B" is set to about 2.7:1. The widths of the piezoelectric materials "A" and "B" in the azimuth direction (X-axis direction) are equal. Thereby, the contact area between the piezoelectric material "A" and the individual electrode 2*a* is about 2.7-times the contact area between the piezoelectric material "B" and the individual electrode 2*a*, and the contact area between the piezoelectric material "A" and the common electrode 2*c* is about 2.7-times the contact area between the piezoelectric material "B" and the common electrode 2*c*. Therefore, the capacitance in the part of the piezoelectric material "A" is equal to the capacitance in the part of the piezoelectric material "B", and the drive efficiency is equalized.

Generally, in the case where plural piezoelectric materials included in one vibrator respectively have plural different relative permittivities, the electrode contact areas of the plural piezoelectric materials are not necessarily determined according to the ratio of relative permittivity $\epsilon$33. A reasonable effect is obtained when the electrode contact area of the piezoelectric material having the smaller relative permittivity $\epsilon$33 is made larger than the electrode contact area of the piezoelectric material having the larger relative permittivity $\epsilon$33. Further, it is desirable that the sizes of piezoelectric materials are determined in view of the piezoelectric constants d33 that affect the transmission and reception sensitivity.

Figure 7:
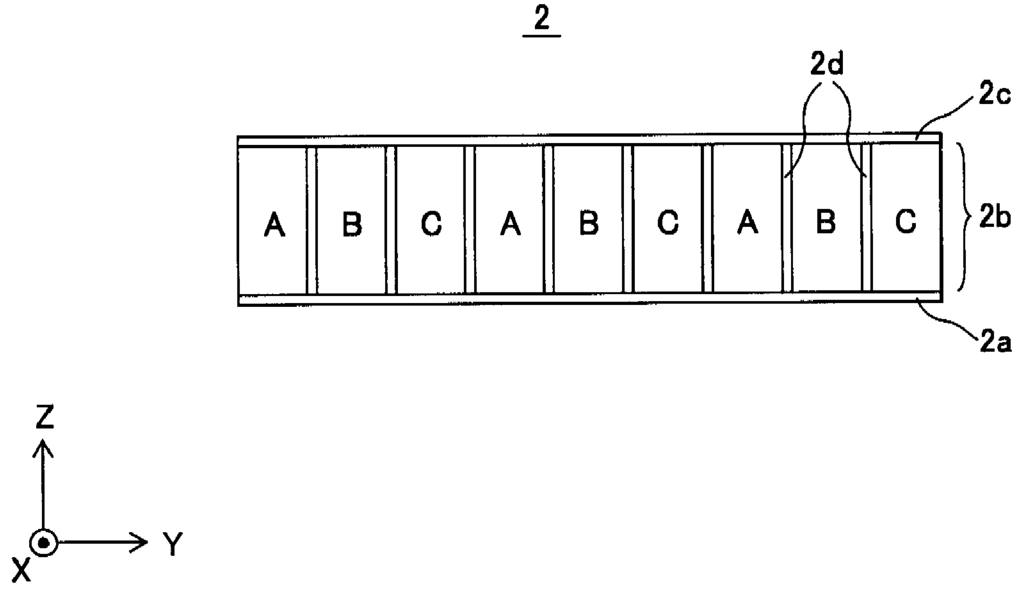
FIG. 7 is a side view showing a second modified example of the vibrator used in the ultrasonic probe according to the first embodiment of the present invention.

FIG. 7 is a side view showing a second modified example of the vibrator used in the ultrasonic probe according to the first embodiment of the present invention. In the second modified example, three kinds of piezoelectric materials A-C are used. The vibrator 2 includes an individual electrode 2*a* provided on the backing material 1 (FIG. 1), a piezoelectric material layer 2*b* including three kinds of piezoelectric materials A-C arranged in parallel on the individual electrode 2*a*, and a common electrode 2*c* formed on the piezoelectric material layer 2*b*. In the piezoelectric material layer 2*b*, the space between the two piezoelectric materials adjacent in the elevation direction (Y-axis direction) are filled with insulating materials 2*d*. Further, four or more kinds of piezoelectric materials may be used.

Next, a method of manufacturing the vibrator shown in FIG. 2 will be explained.

Figure 8A:
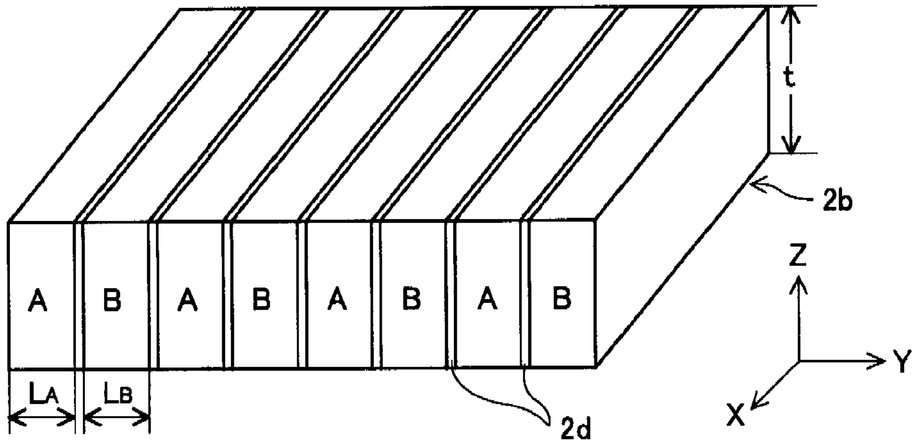
FIGS. 8A-8C are diagrams for explanation of a method of manufacturing the vibrator shown in FIG. 2.
Figure 8B:
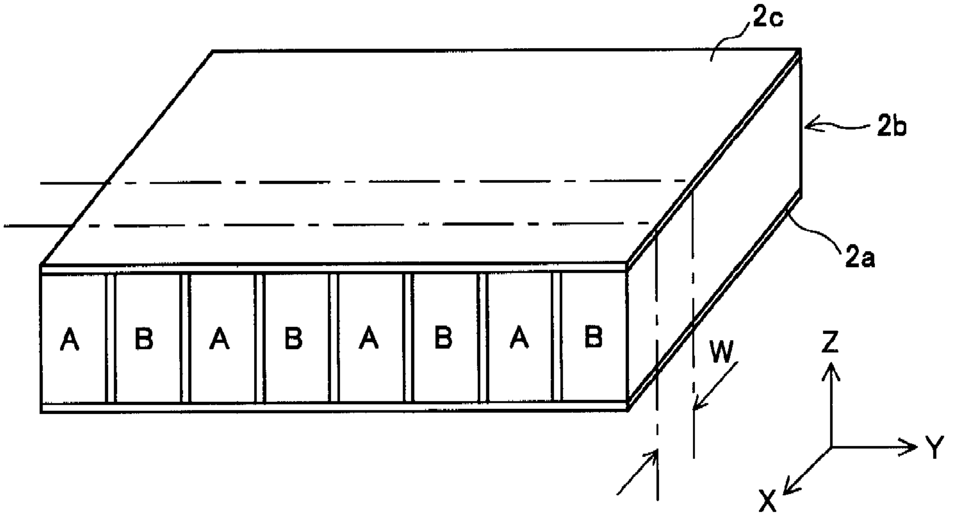
Figure 8C:
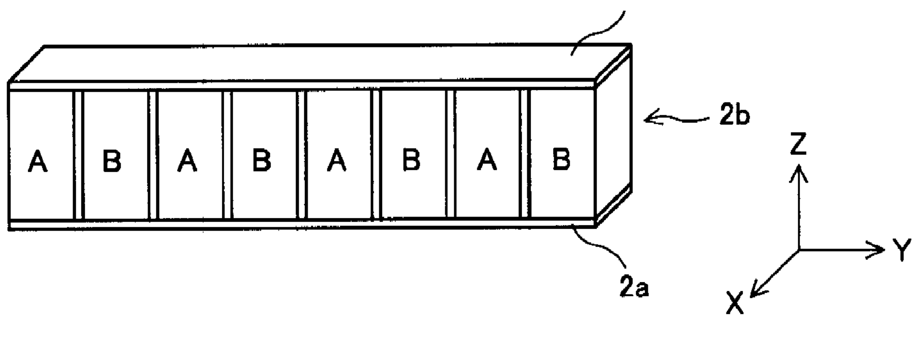

FIGS. 8A-8C are diagrams for explanation of the method of manufacturing the vibrator shown in FIG. 2.

First, as shown in FIG. 8A, the respective piezoelectric materials "A" and "B" having different frequency characteristics are worked into sliced pieces, the pieces are alternately arranged and bonded using an adhesive agent or a filling material of epoxy resin or the like (the insulating material 2*d*), and thereby, the piezoelectric material layer 2*b* is formed.

Here, the lengths $L_A$ and $L_B$ of the piezoelectric materials “A” and “B” (in the Y-axis direction) are 0.30 mm, for example, and the thickness t (in the Z-axis direction) of the piezoelectric materials “A” and “B” is 0.60 mm, for example.

Then, as shown in FIG. 8B, the individual electrode 2*a* and the common electrode 2*c* are respectively formed on the lower surface and the upper surface of the piezoelectric material layer 2*b*. Then, the piezoelectric material layer 2*b* on which the individual electrode 2*a* and the common electrode 2*c* have been formed is cut in predetermined widths along dashed-dotted lines using a dicing saw, and thereby, the vibrator shown in FIG. 8C is completed. The width (in the X-axis direction) of the piezoelectric material layer 2*b* is 0.20 mm, for example.

Next, the second embodiment of the present invention will be explained. An ultrasonic probe according to the second embodiment uses multilayered vibrators in the one-dimensional vibrator array of the ultrasonic probe according to the first embodiment. The rest of the configuration is the same as that of the first embodiment.

Figure 9:
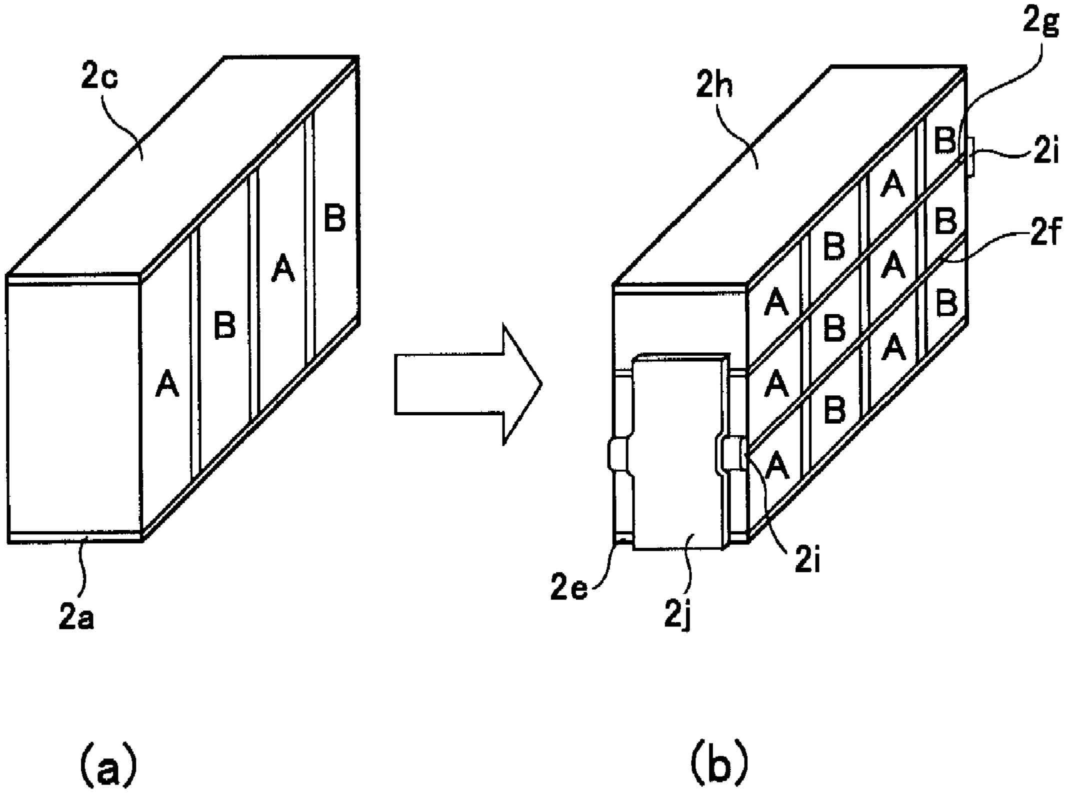
FIG. 9 shows vibrator structures in comparison between the first embodiment and the second embodiment of the present invention.

FIG. 9 shows vibrator structures in comparison between the first embodiment and the second embodiment of the present invention. In the first embodiment, as shown in FIG. 9 (*a*), the vibrator includes two-kinds of piezoelectric materials “A” and “B” arranged in parallel between the individual electrode 2*a* and the common electrode 2*c*.

On the other hand, in the second embodiment, as shown in FIG. 9 (*b*), the vibrator includes plural piezoelectric materials “A” alternately stacked between a lower electrode layer 2*e* and an upper electrode layer 2*h* with internal electrode layers 2*f* and 2*g* in between, plural piezoelectric materials “B” alternately stacked between the lower electrode layer 2*e* and the upper electrode layer 2*h* with internal electrode layers 2*f* and 2*g* in between, insulating films 2*i*, a first side electrode 2*j*, and a second side electrode (not shown), and has a multilayered structure.

Here, the lower electrode layer 2*e* is connected to the first side electrode 2*j* and insulated from the second side electrode. The upper electrode layer 2*h* is connected to the second side electrode and insulated from the first side electrode 2*j*. Further, the internal electrode layer 2*f* is connected to the second side electrode and insulated from the first side electrode 2*j* by the insulating film 2*i*. On the other hand, the internal electrode layer 2*g* is connected to the first side electrode 2*j* and insulated from the second side electrode by the insulating film 2*i*. The plural electrodes are formed in this fashion, three sets of electrodes for applying electric fields to the three layers of piezoelectric materials are connected in parallel. The number of piezoelectric materials is not limited to three, but may be two or four or more.

In the multilayered piezoelectric vibrator, the area of opposed electrodes becomes larger than that of the single-layered element, and the electric impedance becomes lower. Therefore, the multilayered piezoelectric vibrator operates more efficiently for the applied voltage than a single-layered piezoelectric vibrator having the same size. Specifically, given that the number of piezoelectric material layers is N, the number of the multilayered piezoelectric vibrator is N-times the number of piezoelectric material layers of the single-layered piezoelectric vibrator and the thickness of each layer of the multilayered piezoelectric vibrator is 1/N of the thickness of each layer of the single-layered piezoelectric vibrator, and the electric impedance of the multilayered piezoelectric vibrator is $1/N^2$-times the electric impedance of the single-layered piezoelectric vibrator. Therefore, the electric impedance of the vibrator can be adjusted by increasing or decreasing the number of stacked piezoelectric material layers, and thus, the electric impedance matching between a drive circuit or preamplifier and itself is easily provided, and the sensitivity can be improved.

Next, the third embodiment of the present invention will be explained. An ultrasonic probe according to the third embodiment uses a two-dimensional vibrator array in place of the one-dimensional vibrator array of the ultrasonic probe according to the first embodiment. The rest of the configuration is the same as that of the first embodiment.

Figure 10:
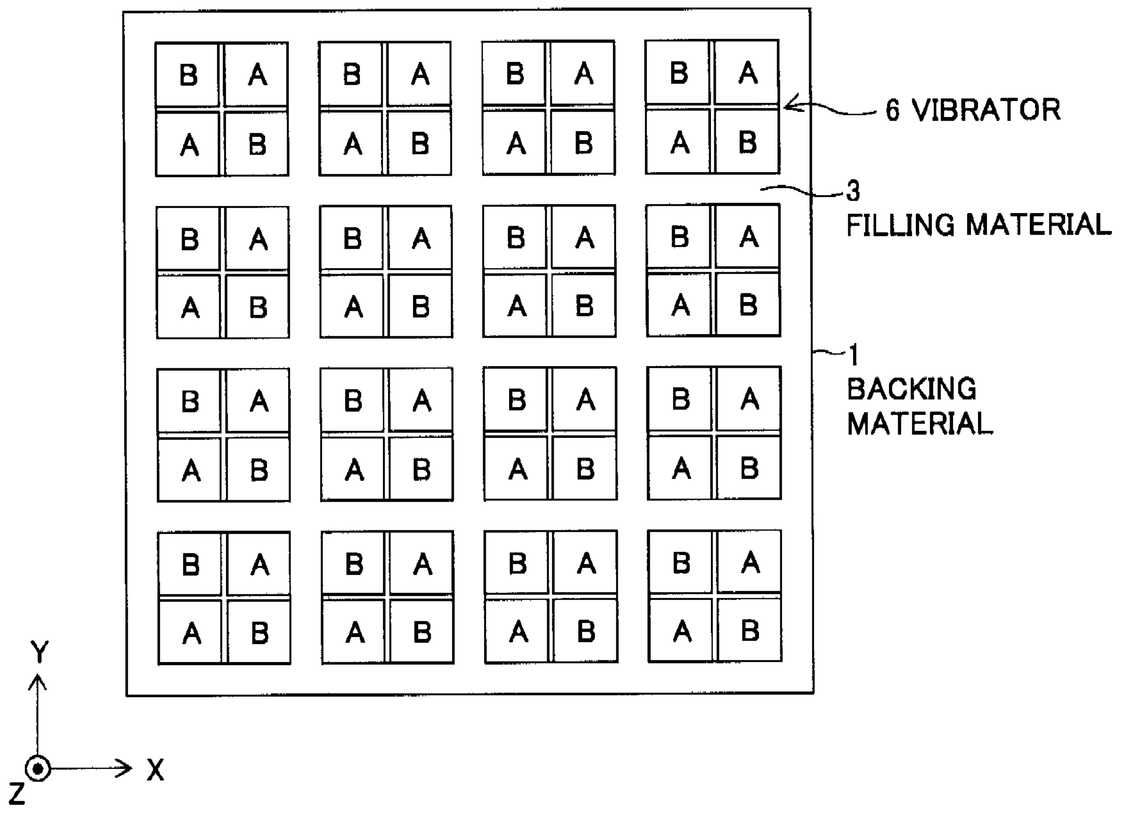
FIG. 10 is a plan view schematically showing an internal structure of the ultrasonic probe according to the third embodiment of the present invention.

FIG. 10 is a plan view schematically showing an internal structure of the ultrasonic probe according to the third embodiment of the present invention. In FIG. 10, to show the arrangement of piezoelectric materials, the common electrodes, the acoustic matching layers, and the acoustic lenses are omitted. The ultrasonic probe is used in contact with an object to be inspected when extracavitary scan is performed or inserted into a body cavity of the object for use when intracavitary scan is performed.

As shown in FIG. 10, the ultrasonic probe has a backing material 1, plural ultrasonic transducers (piezoelectric vibrators) 6 provided on the backing material 1, and filling materials 3 of epoxy resin or the like filling between or around the plural vibrators. Further, the ultrasonic probe has at least one acoustic matching layer provided on the vibrator 6 and an acoustic lens provided on the acoustic matching layer according to need like the one shown in FIG. 1. In the embodiment, the plural piezoelectric vibrators 6 arranged in the X-axis direction and the Y-axis direction form a two-dimensional vibrator array.

Figure 11:
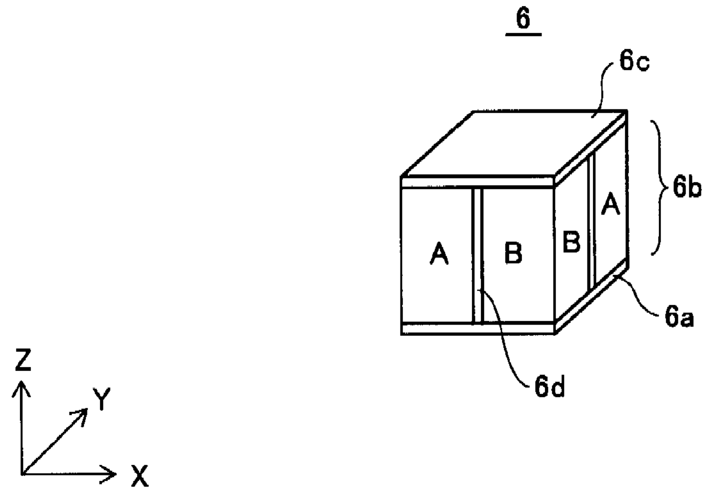
FIG. 11 is a perspective view showing a vibrator used in the ultrasonic probe according to the third embodiment of the present invention.

FIG. 11 is a perspective view showing a structure of the vibrator used in the ultrasonic probe according to the third embodiment of the present invention. The vibrator 6 includes an individual electrode 6*a* provided on the backing material 1 (FIG. 10), a piezoelectric material layer 6*b* including two kinds of piezoelectric materials “A” and “B” arranged in parallel on the individual electrode 6*a*, and a common electrode 6*c* formed on the piezoelectric material layer 6*b*. In the piezoelectric material layer 6*b*, the space between the plural adjacent piezoelectric materials are filled with insulating materials 6*d* containing an adhesive agent or a filling material of epoxy resin or the like.

As the piezoelectric materials “A” and “B”, the same materials as those explained in the first embodiment may be used. The polarization direction of the piezoelectric materials “A” and “B” is the Z-axis direction. Further, it is desirable that the insulating material 6*d* has a high insulation property and resistivity equal to or more than $1\times10^{12}$ Ωcm. Thereby, electric isolation between the individual electrode 6*a* and the common electrode 6*c* is held. Further, it is desirable that the shore hardness “D” of the insulating material 6*d* is less than “65”.

Typically, the common electrodes 6*c* of the plural vibrators are commonly connected to the ground potential (GND) Further, the individual electrodes 6*a* of the plural vibrators 6 are connected to cables (shield cables) via lead wires provided within the backing material 1, and furthermore, connected to an electronic circuit within an ultrasonic diagnostic apparatus main body via the cables.

The vibrators 6 generate ultrasonic waves based on the drive signals supplied from the ultrasonic diagnostic apparatus main body. Further, the vibrators 6 receive ultrasonic echoes propagating from the object and generate electric signals. The electric signals are outputted to the ultrasonic diagnostic apparatus main body and processed as reception signals of the ultrasonic echoes.

In the case where the values of relative permittivity ε33 of the piezoelectric materials “A” and “B” are different, in order to equalize the capacitance in the part of the piezoelectric material "A" and the capacitance in the part of the piezoelectric material "B", sizes of the piezoelectric materials "A" and "B" may be varied depending on the values of relative permittivity ∈33 of the piezoelectric materials "A" and "B". Further, it is desirable that the sizes of piezoelectric materials are determined in view of the piezoelectric constants d33 that affect the transmission and reception sensitivity. Furthermore, three or more kinds of piezoelectric materials may be used.

Next, a method of manufacturing the vibrator shown in FIG. 11 will be explained.

Figure 12A:
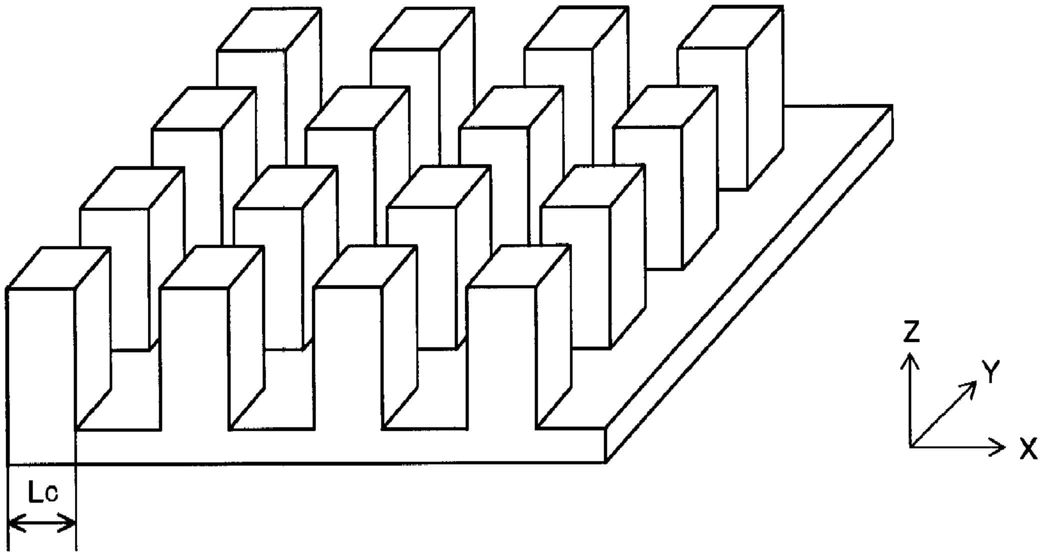
FIGS. 12A and 12B are diagrams for explanation of a method of manufacturing the vibrator shown in FIG. 11.
Figure 12B:
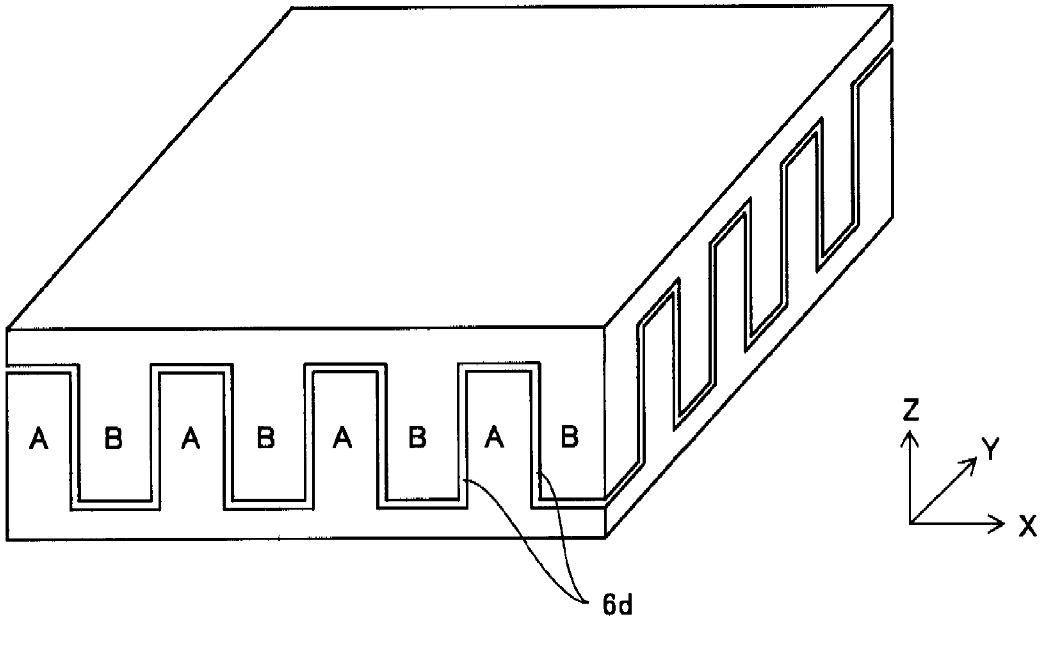

FIGS. 12A and 12B are diagrams for explanation of the method of manufacturing the vibrator shown in FIG. 11.

First, as shown in FIG. 12A, the respective plate-like piezoelectric materials "A" and "B" having different frequency characteristics are worked using the LIGA (Lithographie Galvanoformung Abformung) process or a dicing saw and a structure in which plural rectangular columns are two-dimensionally arranged is fabricated. The length $L_C$ of one side at the bottom surface of the rectangular column (in the X-axis direction and the Y-axis direction) is 50 μm, for example.

Then, the worked piezoelectric material "A" and piezoelectric material "B" are opposed, the rectangular columns of the piezoelectric material "A" and the rectangular columns of piezoelectric material "B" are engaged, the gaps are filled by an adhesive agent or a filling material of epoxy resin or the like (insulating materials 6*d*) and secured, and thereby, a composite piezoelectric material as shown in FIG. 12B is formed. By cutting a part of the composite piezoelectric material by dicing or the like, the vibrator as shown in FIG. 11 is completed.

Figure 13:
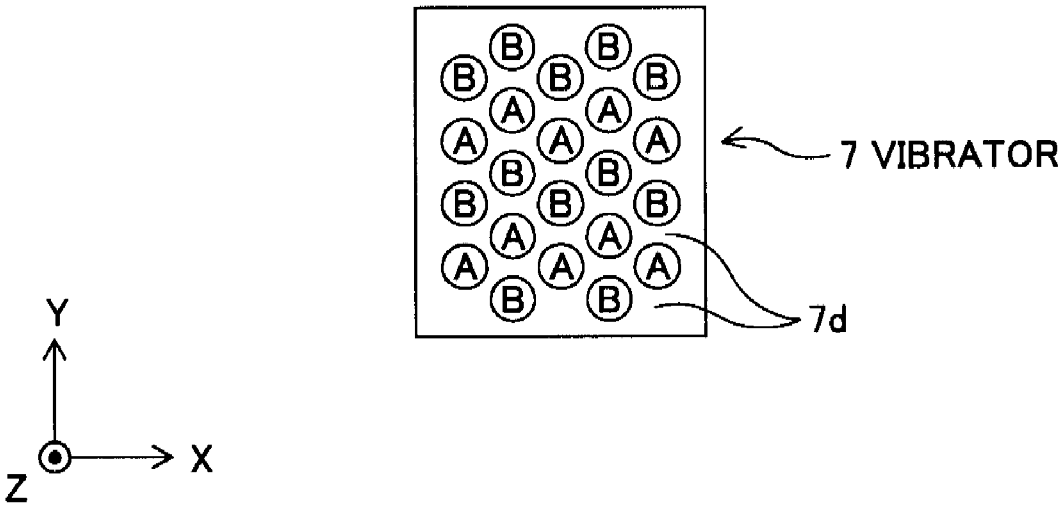
FIG. 13 is a plan view showing a modified example of the vibrator used in the ultrasonic probe according to the third embodiment of the present invention.
Figure 14:
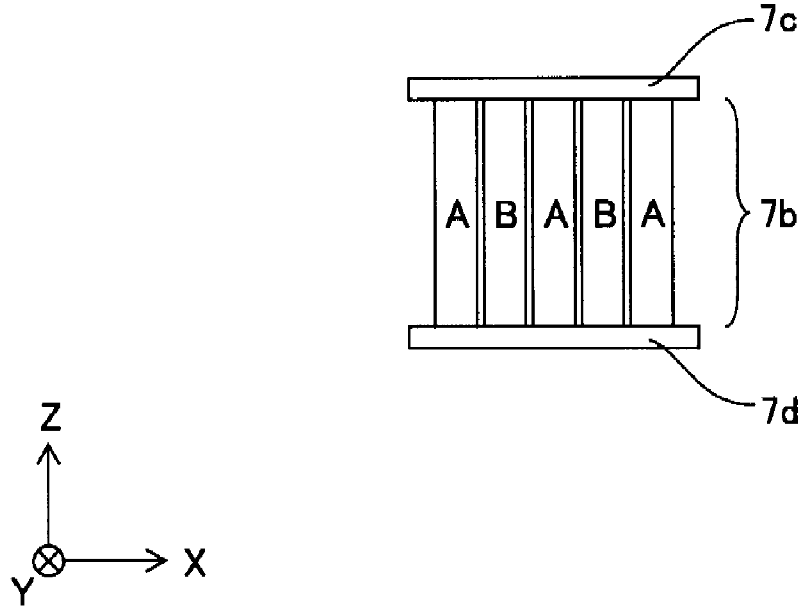
FIG. 14 is a side view of the vibrator shown in FIG. 13.

FIG. 13 is a plan view showing a modified example of the vibrator used in the ultrasonic probe according to the third embodiment of the present invention, and FIG. 14 is a side view of the vibrator shown in FIG. 13. To show the arrangement of piezoelectric materials, common electrodes 7*c* are omitted in FIG. 13, and insulating materials 7*d* are omitted in FIG. 14.

The vibrator 7 includes an individual electrode 7*a* provided on the backing material 1 (FIG. 10), a piezoelectric material layer 7*b* including two kinds of fibrous piezoelectric materials "A" and "B" arranged in parallel on the individual electrode 7*a*, and a common electrode 7*c* formed on the piezoelectric material layer 7*b*. In the piezoelectric material layer 7*b*, the spaces between and around the plural adjacent piezoelectric materials are filled with insulating materials 7*d* containing an adhesive agent or a filling material of epoxy resin or the like.

As the piezoelectric materials "A" and "B", the same materials as those explained in the first embodiment may be used. The polarization direction of the piezoelectric materials "A" and "B" is the Z-axis direction. Further, it is desirable that the insulating material 7*d* has a high insulation property and resistivity equal to or more than $1\times10^{12}$ Ωcm. Thereby, electric isolation between the individual electrode 7*a* and the common electrode 7*c* is held. Further, it is desirable that the shore hardness "D" of the insulating material 7*d* is less than "65".

When the values of relative permittivity ∈33 of the piezoelectric materials "A" and "B" are different, in order to equalize the capacitance in the part of the piezoelectric material "A" and the capacitance in the part of the piezoelectric material "B", sizes of the piezoelectric materials "A" and "B" may be varied depending on the values of relative permittivity ∈33 of the piezoelectric materials "A" and "B". Further, it is desirable that the sizes and number of the piezoelectric materials "A" and "B" are determined in view of the piezoelectric constants d33 that affect the transmission and reception sensitivity. Furthermore, three or more kinds of piezoelectric materials may be used. In this case, the combination of PMN-PT, a soft material, and a hard material is effective.

Next, the fourth embodiment of the present invention will be explained. An ultrasonic probe according to the fourth embodiment uses multilayered vibrators in the two-dimensional vibrator array of the ultrasonic probe according to the third embodiment.

Figure 15:
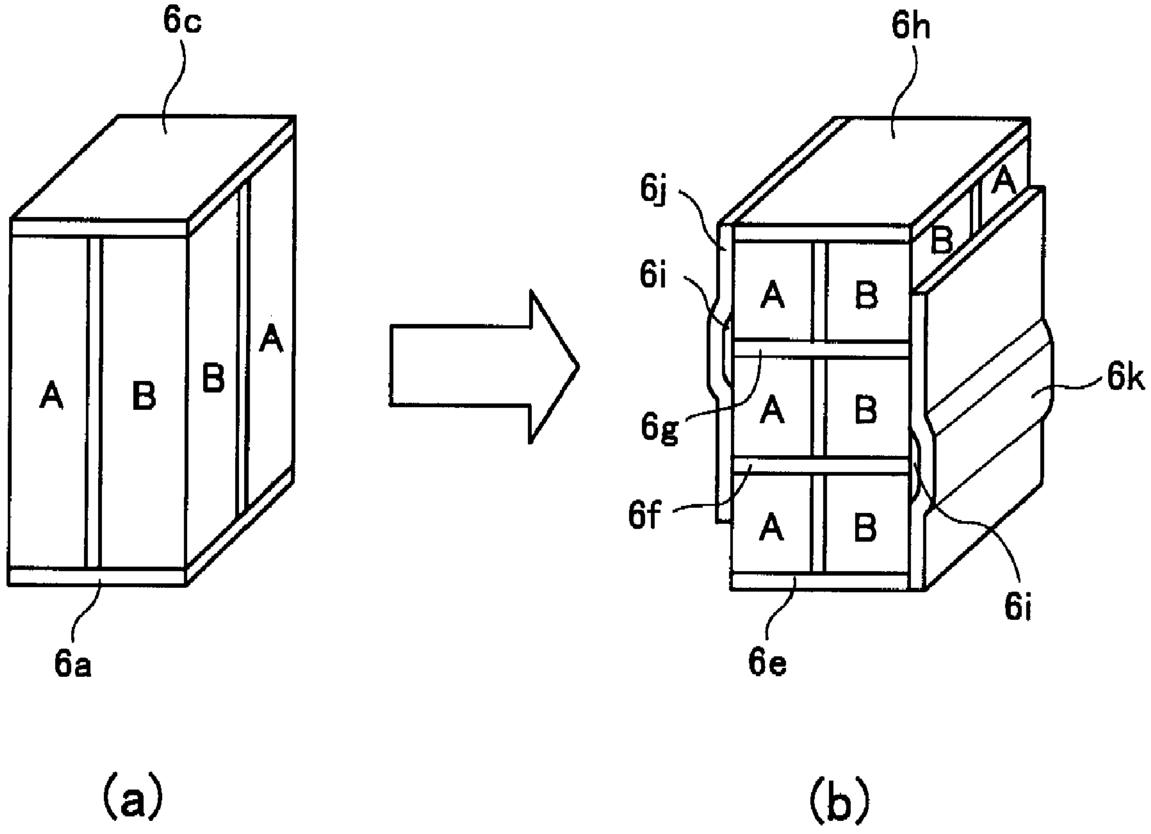
FIG. 15 shows vibrator structures in comparison between the third embodiment and the fourth embodiment of the present invention.

FIG. 15 shows vibrator structures in comparison between the third embodiment and the fourth embodiment of the present invention. In the third embodiment shown in FIG. 15 (*a*), the piezoelectric vibrator includes two-kinds of piezoelectric materials "A" and "B" arranged in parallel between the individual electrode 6*a* and the common electrode 6*c*.

On the other hand, in the fourth embodiment, as shown in FIG. 15 (*b*), the vibrator includes plural piezoelectric materials "A" alternately stacked between a lower electrode layer 6*e* and an upper electrode layer 6*h* with internal electrode layers 6*f* and 6*g* in between, plural piezoelectric materials "B" alternately stacked between the lower electrode layer 6*e* and the upper electrode layer 6*h* with internal electrode layers 6*f* and 6*g* in between, insulating films 6*i*, a first side electrode 6*j*, and a second side electrode 6*k*, and has a multilayered structure.

Here, the lower electrode layer 6*e* is connected to the second side electrode 6*k* and insulated from the first side electrode 6*j*. The upper electrode layer 6*h* is connected to the first side electrode 6*j* and insulated from the second side electrode 6*k*. Further, the internal electrode layer 6*f* is connected to the first side electrode 6*j* and insulated from the second side electrode 6*k* by the insulating film 6*i*. On the other hand, the internal electrode layer 6*g* is connected to the second side electrode 6*k* and insulated from the first side electrode 6*j* by the insulating film 6*i*. The plural electrodes are formed in this fashion, three sets of electrodes for applying electric fields to the three layers of piezoelectric materials are connected in parallel. The number of piezoelectric materials is not limited to three, but may be two or four or more.

The invention claimed:

1. An ultrasonic probe comprising:

a vibrator array including plural vibrators for transmitting and/or receiving ultrasonic waves, each of said plural vibrators including plural piezoelectric materials arranged in parallel between a first electrode and a second electrode and having different frequency constants from one another;

at least one acoustic matching layer provided on a first surface of said vibrator array; and a backing material provided on a second surface opposite to the first surface of said vibrator array.

2. The ultrasonic probe according to claim 1, further comprising:

an acoustic lens provided on said at least one acoustic matching layer.

3. The ultrasonic probe according to claim 1, wherein each of said plural vibrators includes one of an adhesive agent and a filing material having resistivity not less than $1\times10^{12}$ Ωcm and filling spaces between said plural piezoelectric materials.

4. The ultrasonic probe according to claim 1, wherein each of said plural piezoelectric materials includes one of a piezoelectric single crystal and a piezoelectric ceramic.

5. The ultrasonic probe according to claim 1, wherein said plural piezoelectric materials generate ultrasonic outputs having plural different frequency characteristics, respectively, and each ultrasonic output at a frequency, at which adjacent two of said plural different frequency characteristics intersect, is not less than 0.5-times a peak value of respective one of the adjacent two frequency characteristics.

6. The ultrasonic probe according to claim 1, wherein said plural piezoelectric materials have plural different relative permittivities, respectively, and a piezoelectric material having a smaller relative permittivity has a larger contact area between said first electrode and said second electrode than that of a piezoelectric material having a larger relative permittivity.

7. The ultrasonic probe according to claim 1, wherein each of said plural vibrators includes plural first piezoelectric materials alternately stacked between said first electrode and said second electrode with at least one internal electrode layer in between and plural second piezoelectric materials alternately stacked between said first electrode and said second electrode with at least one internal electrode layer in between.

* * * * *